(12) United States Patent
Yow et al.

(10) Patent No.: US 9,997,445 B2
(45) Date of Patent: Jun. 12, 2018

(54) SUBSTRATE INTERCONNECTIONS FOR PACKAGED SEMICONDUCTOR DEVICE

(71) Applicant: NXP USA, INC., Austin, TX (US)

(72) Inventors: Kai Yun Yow, Petaling Jaya (MY); Chee Seng Foong, Austin, TX (US); Bihua He, Tianjin (CN); Navas Khan Oratti Kalandar, Austin, TX (US); Lan Chu Tan, Singapore (SG); Yuan Zang, Tianjin (CN)

(73) Assignee: NXP USA, INC., Austin, TX (US)

( * ) Notice: Subject to any disclaimer, the term of this patent is extended or adjusted under 35 U.S.C. 154(b) by 0 days. days.

(21) Appl. No.: 15/381,058

(22) Filed: Dec. 15, 2016

(65) Prior Publication Data

US 2018/0114748 A1   Apr. 26, 2018

(30) Foreign Application Priority Data

Oct. 21, 2016   (CN) .......................... 2016 1 0919948

(51) Int. Cl.
| | |
|---|---|
| *H01L 23/495* | (2006.01) |
| *H01L 23/498* | (2006.01) |
| *H01L 23/00* | (2006.01) |
| *H01L 23/58* | (2006.01) |

(52) U.S. Cl.
CPC .. *H01L 23/49838* (2013.01); *H01L 23/49811* (2013.01); *H01L 23/585* (2013.01); *H01L 24/06* (2013.01); *H01L 24/81* (2013.01); *H01L 2224/0401* (2013.01); *H01L 2224/04042* (2013.01)

(58) Field of Classification Search
None
See application file for complete search history.

(56) References Cited

U.S. PATENT DOCUMENTS

| | | | |
|---|---|---|---|
| 5,716,889 A | 2/1998 | Tsuji et al. | |
| 5,777,392 A | 7/1998 | Fujii | |
| 5,942,805 A | 8/1999 | Winer et al. | |
| 6,075,710 A * | 6/2000 | Lau ................... | H01L 23/49816 174/255 |
| 6,111,756 A | 8/2000 | Moresco | |
| 6,174,175 B1 * | 1/2001 | Behfar ................. | H01R 12/714 439/91 |
| 6,489,682 B1 * | 12/2002 | Yeh ......................... | G01B 7/02 257/738 |
| 6,638,831 B1 * | 10/2003 | Roberts ................ | H01L 23/544 257/E23.179 |
| 7,402,507 B2 | 7/2008 | Standing et al. | |
| 7,898,095 B2 | 3/2011 | Patti | |
| 8,222,121 B2 * | 7/2012 | Patti .................. | H01L 21/76898 257/774 |
| 9,437,492 B2 | 9/2016 | Yow et al. | |

(Continued)

*Primary Examiner* — David E Graybill
(74) *Attorney, Agent, or Firm* — Charles E. Bergere

(57) ABSTRACT

A "universal" substrate for a semiconductor device is formed of a non-conductive substrate material. A uniform array of conductive pillars is formed in the substrate material. The pillars extend from a top surface of the substrate material to a bottom surface of the substrate material. A die flag may be formed on the top surface of the substrate material. Pillars underneath the die flag are connected to pillars beyond a perimeter of the die flag with wires. Power and ground rings may be formed by connecting rows of pillars that surround the die flag.

8 Claims, 6 Drawing Sheets

(56) References Cited

U.S. PATENT DOCUMENTS

| | | |
|---|---|---|
| 9,508,634 B2 * | 11/2016 | Liu .................... H01L 23/49586 |
| 2002/0058396 A1 | 5/2002 | Roberts |
| 2002/0114135 A1 * | 8/2002 | Akram ................ H01L 23/3121 |
| | | 361/704 |
| 2005/0205778 A1 | 9/2005 | Kitai et al. |
| 2009/0001573 A1 | 1/2009 | Jirawongsapiwat |
| 2009/0195768 A1 | 6/2009 | Bijnen |
| 2010/0181658 A1 * | 7/2010 | Yamashita .......... H01L 23/3107 |
| | | 257/676 |
| 2012/0001306 A1 * | 1/2012 | Wang .................. H01L 21/4832 |
| | | 257/666 |
| 2013/0026632 A1 * | 1/2013 | Kikuchi ............. H01L 21/6835 |
| | | 257/753 |
| 2013/0044206 A1 | 2/2013 | Liu et al. |
| 2013/0052777 A1 | 2/2013 | Xu |
| 2013/0280826 A1 | 10/2013 | Scanlan |
| 2014/0008777 A1 | 1/2014 | Loh et al. |
| 2014/0115886 A1 | 5/2014 | Sevigny |
| 2015/0097203 A1 | 4/2015 | Imangholi et al. |
| 2015/0179584 A1 | 6/2015 | Woerz et al. |
| 2015/0311104 A1 | 10/2015 | Xu |
| 2016/0093533 A1 * | 3/2016 | Yow ........................ H01L 21/78 |
| | | 257/773 |
| 2016/0104662 A1 * | 4/2016 | Prajuckamol ..... H01L 23/49548 |
| | | 257/676 |
| 2016/0143148 A1 * | 5/2016 | Hosomi ................ H05K 1/183 |
| | | 361/761 |
| 2016/0293580 A1 * | 10/2016 | Lee .................... H01L 21/31133 |

\* cited by examiner

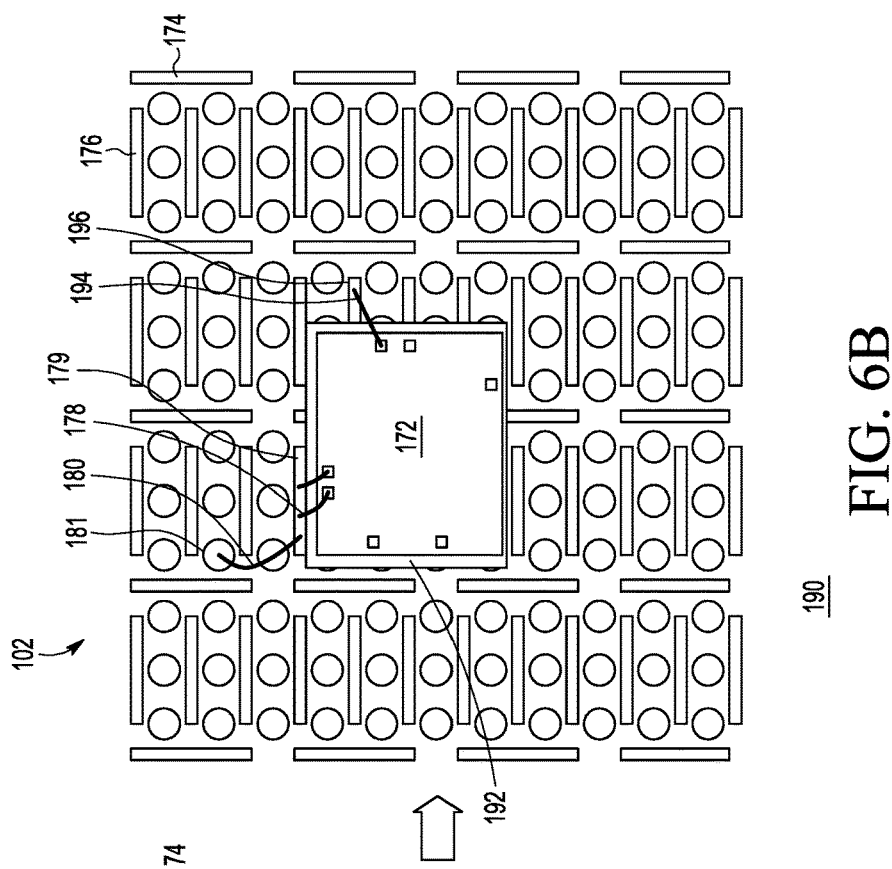
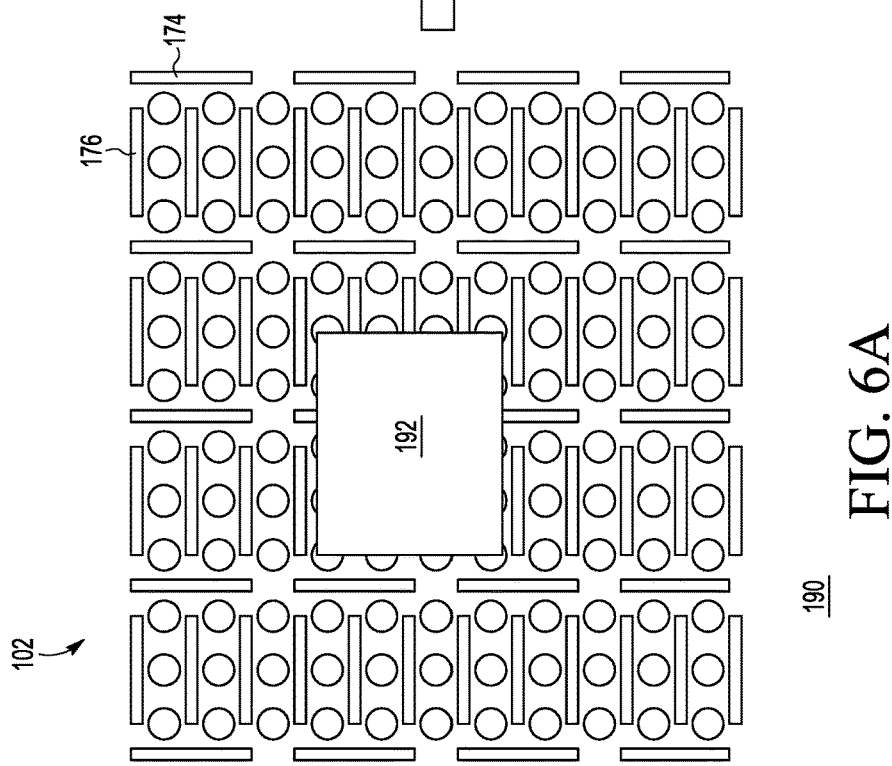

SUBSTRATE INTERCONNECTIONS FOR PACKAGED SEMICONDUCTOR DEVICE

BACKGROUND

The present invention relates to integrated circuit (IC) packaging, and more particularly, to substrates for semiconductor packages.

Substrates that include an array of interconnections (e.g., copper pillars) and used for semiconductor packaging are known, such as from U.S. Pat. No. 9,437,492 assigned to Freescale Semiconductor, Inc. In assembling a semiconductor device, a semiconductor die is mounted on and attached to a set of the pillars and then electrically connected to other ones of the pillars with bond wires. The die and bond wires are then encapsulated with a plastic material to form a packaged device. Unfortunately, the pillars beneath the die or the pillars upon which the die is mounted are not able to be used because they are covered by the die. It would be advantageous to be able to make use of these pillars.

DESCRIPTION OF THE DRAWINGS

Embodiments of the invention will become more fully apparent from the in which like reference numerals identify similar or identical elements.

FIGS. 6A and 6B are top plans views of a partially assembled semiconductor device according to yet another embodiment of the present invention.

DETAILED DESCRIPTION

Figure 1:
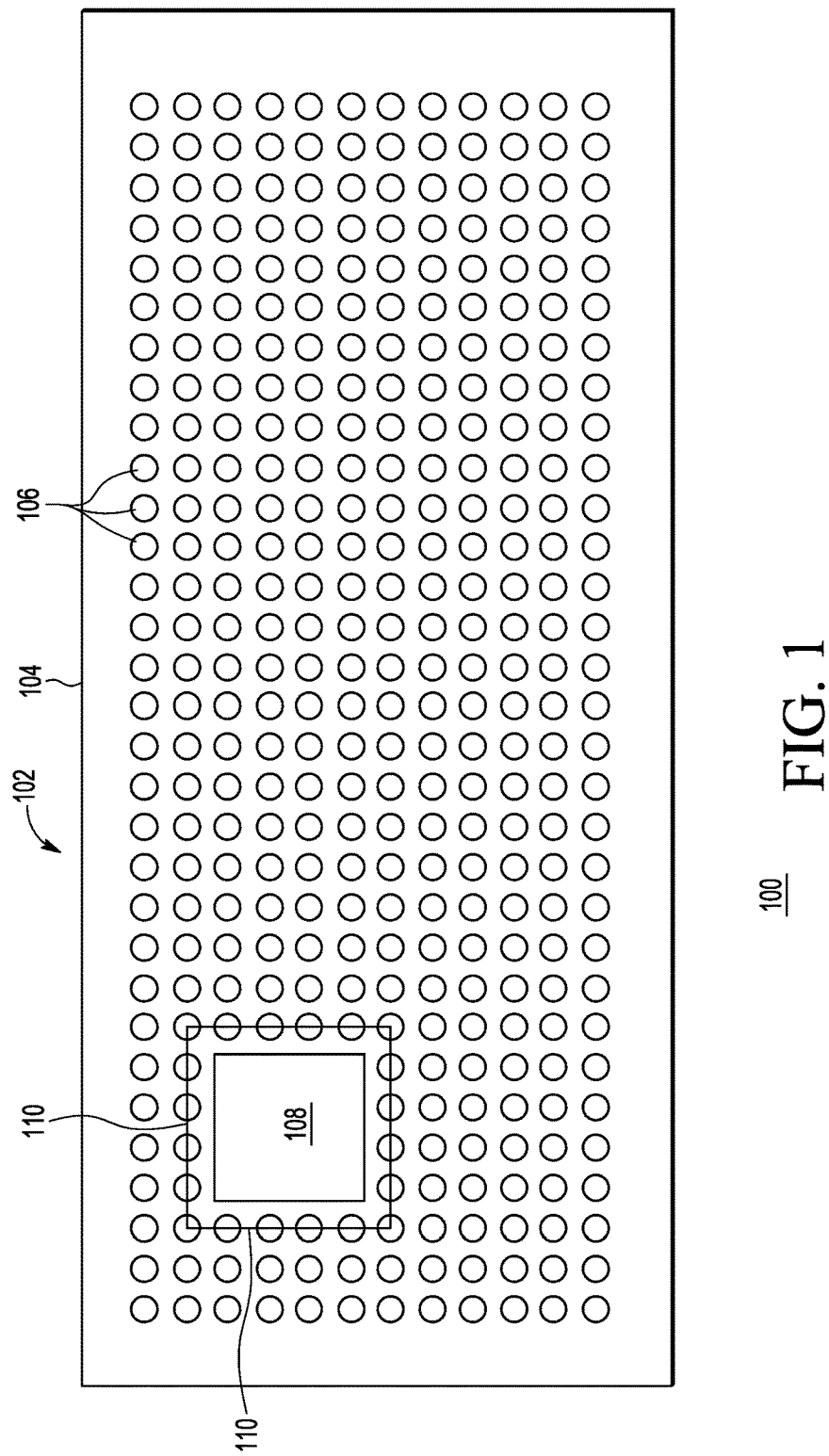
FIG. 1 is a top plan view of a partially assembled semiconductor device according to one embodiment of the present invention.

Detailed illustrative embodiments of the present invention are disclosed herein. However, specific structural and functional details disclosed herein are merely representative for purposes of describing example embodiments of the present invention. The present invention may be embodied in many alternate forms and should not be construed as limited to only the embodiments set forth herein. Further, the terminology used herein is for the purpose of describing particular embodiments only and is not intended to be limiting of example embodiments of the invention.

As used herein, the singular forms "a," "an," and "the," are intended to include the plural forms as well, unless the context clearly indicates otherwise. It further will be understood that the terms "comprises," "comprising," "includes," and/or "including," specify the presence of stated features, steps, or components, but do not preclude the presence or addition of one or more other features, steps, or components. It also should be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In one embodiment, the present invention is a substrate for a semiconductor device comprising a non-conductive substrate material, a uniform array of conductive pillars formed in the substrate material, and a die flag formed on a top surface of the substrate material. The pillars extend from the top surface of the substrate material to a bottom surface of the substrate material.

In another embodiment, the present invention is a packaged semiconductor device. The packaged semiconductor device comprises a non-conductive substrate including a uniform array of conductive pillars extending from a top surface of the substrate to a bottom surface of the substrate; a first electrical connector connecting pillars located under a die footprint to first selected ones of the pillars outside of the die footprint; a semiconductor die having a bottom, non-active surface attached to the top surface of the substrate; and a second electrical connector connecting a first set of pads on a top, active surface of the die to the first selected ones of the pillars outside of the die footprint such that the pillars located under the die footprint are in electrical contact with the first set of pads on the die.

In yet another embodiment the present invention provides a method for making connections between pillars on a semiconductor device substrate. The method comprises: connecting pillars under a die footprint to pillars outside the die footprint; and connecting pads on a die to the pillars outside the die footprint such that the pillars under the die footprint are in electrical contact with the pads on the die. The pillars are formed in a non-conductive substrate material and form a uniform array within the substrate material.

Referring now to FIG. 1, a top plan view of a partially assembled semiconductor device 100 in accordance with an embodiment of the present invention is shown. The device 100 comprises a substrate 102 that comprises a non-conductive substrate material 104 and an array of conductive vias or pillars 106 formed in the substrate material 104. The substrate 102 comprises a "universal" substrate that can be used to package semiconductor dies of varying sizes and with varying numbers of die bonding pads. In one embodiment, the conductive pillars 106 are made of copper, and the non-conducting substrate material 104 is made of bismaleimide triazine (BT), polyimide tape, or any suitable dielectric material, including glass or ceramics. Those skilled in the art will understand that the conductive pillars 106 may be made of other suitable conducting metals or non-metals and/or that the non-conducting substrate material 104 may be made of other suitable non-conducting materials. The pillars 104 extend from a top surface of the substrate 102 to a bottom surface of the substrate 102.

A die 108 is affixed to the top surface of the substrate 102 using a non-conductive epoxy or a die attach film (DAF), as is known in the art. In some embodiments, a die flag may be formed on the top surface of the substrate 102 for receiving the die 108, and then the die 108 would be attached to the die flag with a nonconductive epoxy. The die 108 has a top, active surface that includes a plurality of die bonding pads (not shown in this embodiment) that allow for connection of the die internal circuitry with external circuitry. The semiconductor die 108 may comprise any type of integrated circuit, such as an application specific IC (ASIC), a microprocessor, a sensor, etc., and the present invention is not limited by the type of die.

The device 100 further includes a plurality of bond wires 110, which in this embodiment are attached (bonded) to the row of pillars 106 adjacent to and surrounding the die 108. The combination of these pillars and the bond wires 110 form a ring around the die 108 that may be used as a power or ground ring. Thus, in this embodiment, the pillars 106 adjacent to and surrounding the die 108 are interconnected in a daisy-chain fashion in order to form a ground ring. The bond wires 110 are attached to the pillars 106 using a wire bonding process, and preferably the bond wires have a low loop profile.

Figure 2:
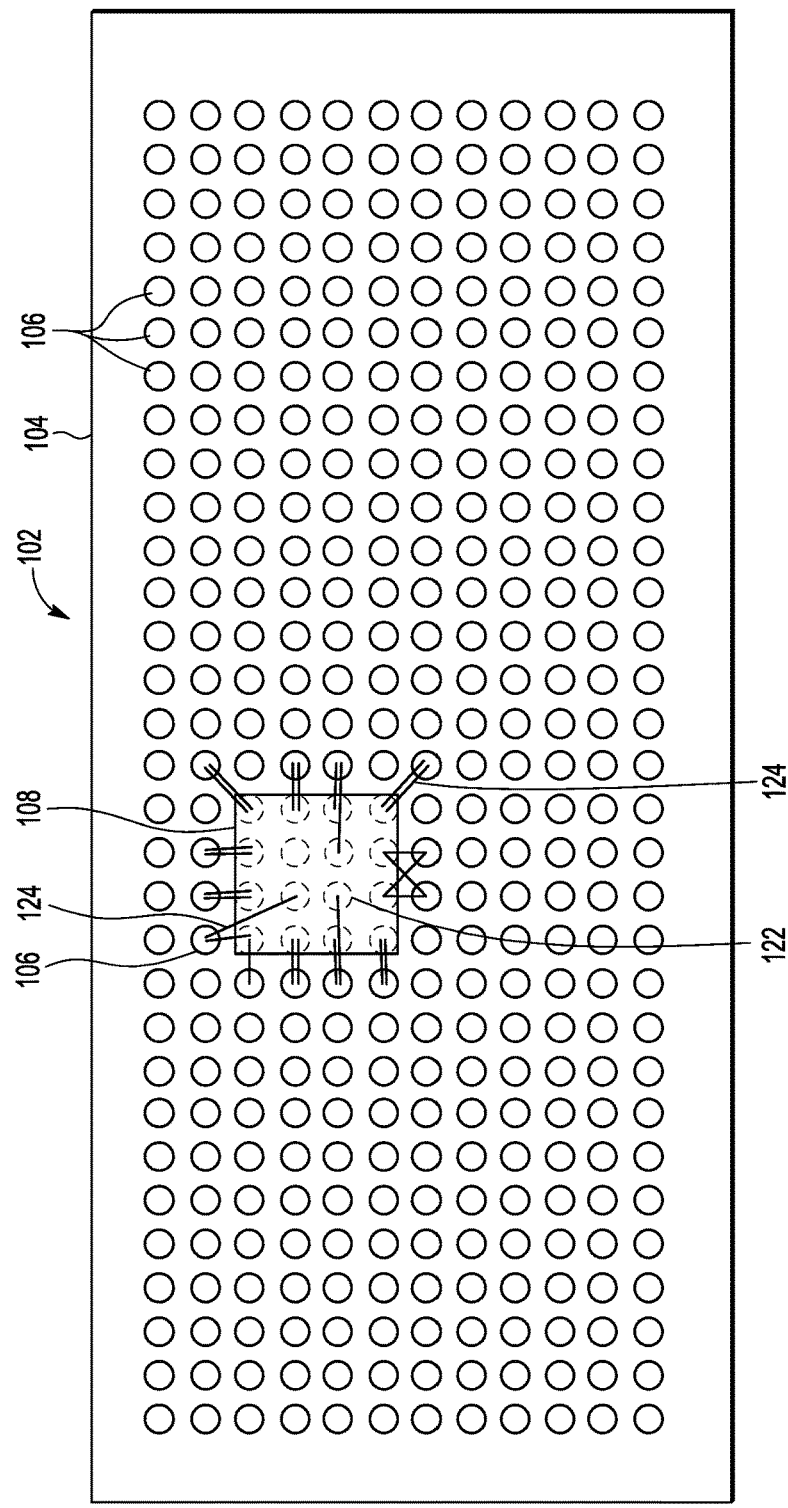
FIG. 2 is a top plan view of a partially assembled semiconductor device according to another embodiment of the present invention.

FIG. 2 is a top plan view of a partially assembled semiconductor device 120 according to another embodiment of the present invention. The device 120 comprises the substrate 102 and the die 108 mounted on and affixed to the substrate 102 with nonconductive epoxy. The die 108 is shown in outline and there are a plurality of the pillars 122 that are located beneath the die 108. In this embodiment, in order to use the pillars 122 beneath the die 108, a plurality of bond wires 124 are wire bonded between the pillars 122 beneath the die 108 and respective ones of the pillars 106 that are not beneath the die 108. As illustrated in the drawing, the pillars 122 beneath the die 108 may be connected to more than one of the pillars 106 with more than one of the bond wires 124. In a presently preferred embodiment, the bond wires 124 are attached to the pillars at the top surface of the substrate 102 before the die 108 is mounted thereon. The bond wires 124 have a low loop profile. In other embodiments, the bond wires 124 may be attached to the bottom side of the substrate 102 either before or after the die 108 is mounted on the substrate 102 top side. Thus, in this manner, the pillars 122 beneath the die 108 are in electrical contact with the pillars 106 outside of the die footprint. After die attach, a second wire bonding process is performed to connect die bonding pads to respective ones of the pillars 106.

Figure 3A:
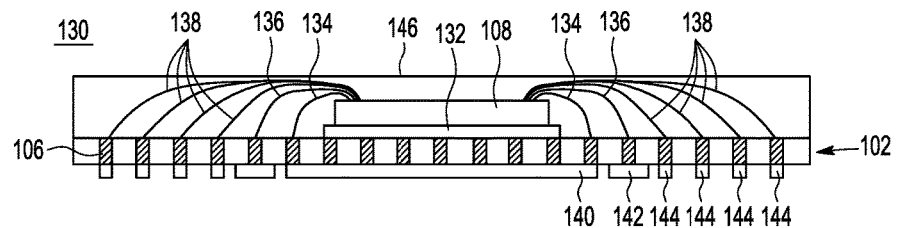
FIGS. 3A and 3B show a cross-sectional side view and a bottom plan view of a portion of a packaged semiconductor device according to an embodiment of the present invention.
Figure 3B:
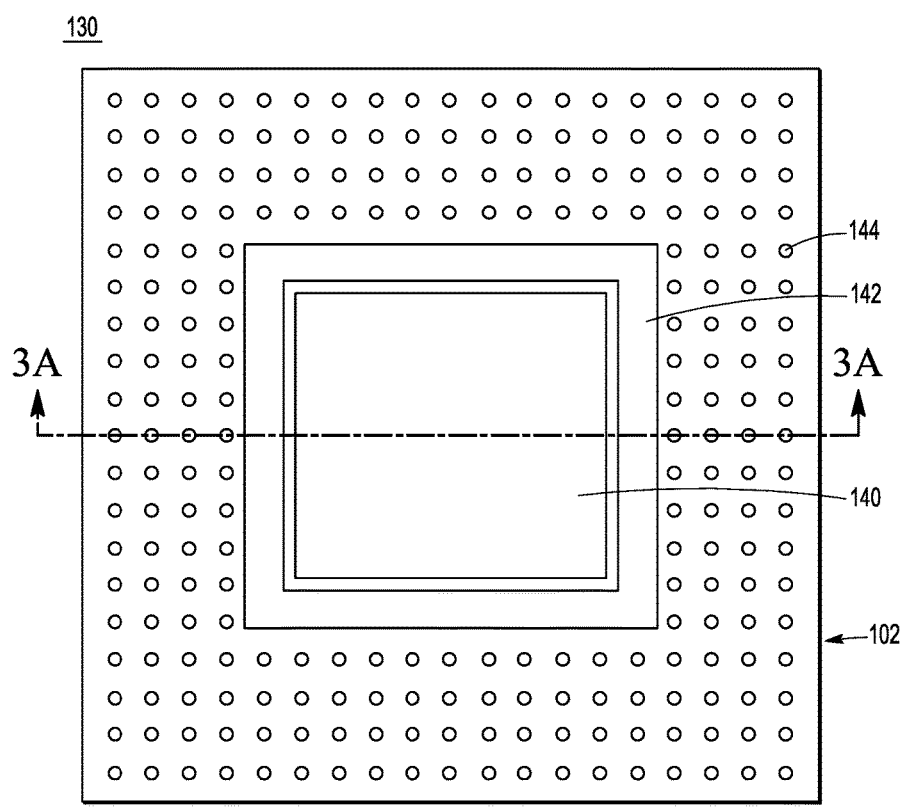

FIGS. 3A and 3B show a cross-sectional side view and a bottom plan view of a portion of a packaged semiconductor device 130 in accordance with an embodiment of the present invention. The packaged semiconductor device 130 comprises the substrate 102 including an array of conductive pillars 106 that extend from a top surface of the substrate 102 to a bottom surface of the substrate 102. The die 108 is mounted and affixed to the top surface of the substrate 102 with a die attach adhesive 132. In alternative embodiments, a die flag may be formed on the top surface of the substrate 102 for receive the die 108.

The die 108 is electrically connected to the pillars 106 with bond wires, as shown. In this embodiment, first bond wires 134 connect selected ones of the die bonding pads to pillars in the row immediately adjacent to and surrounding the die 108; second bond wires 136 connect selected ones of the die bonding pads to the second row of pillars surrounding the die 108, and third bond wires 138 connected selected ones of the die bonding pads to other ones of the pillars outside of the first and second rows of pillars surround the die 108. The first bond wires 134 are used for ground wires, the second bond wires 136 are used for power wires, and the third bond wires 138 are used for signal wires.

Referring now to FIG. 3B as well as FIG. 3A, the device 130 also includes a ground pad 140, a power ring 142, and signal pads 144 formed on the bottom side of the substrate 102. The ground pad 140 and the power ring 142 may be formed using solder or a film tape, and the signal pads 144 may be formed using solder or solder balls. The ground pad 140 is electrically connected to the pillars beneath the die 108 as well as the first row of pillars surrounding the die 108. The power ring 142 is electrically connected to the second row of pillars surrounding the die 108, and the signal pads 144 are electrically connected to the pillars 106 that are connected to the die bonding pads with the bond wires 138 (used to transmit/receive signals from/to the die 108). The top surface of the substrate 102, the die 108 and the bond wires 134, 136 and 138 are encapsulated with a plastic material or mold compound 146 to protect the die, the bond wires and the connections therebetween from damage.

Figure 4A:
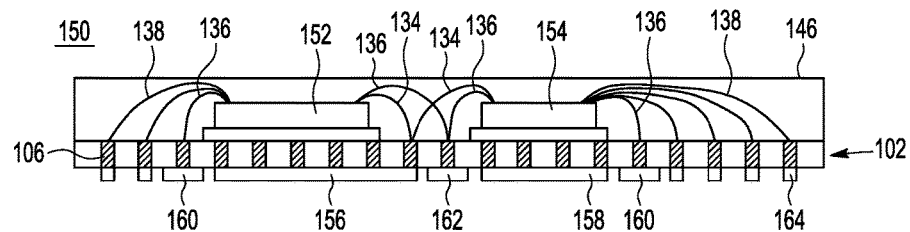
FIGS. 4A and 4B show a cross-sectional side view and a bottom plan view of a portion of a packaged semiconductor device according to another embodiment of the present invention.
Figure 4B:
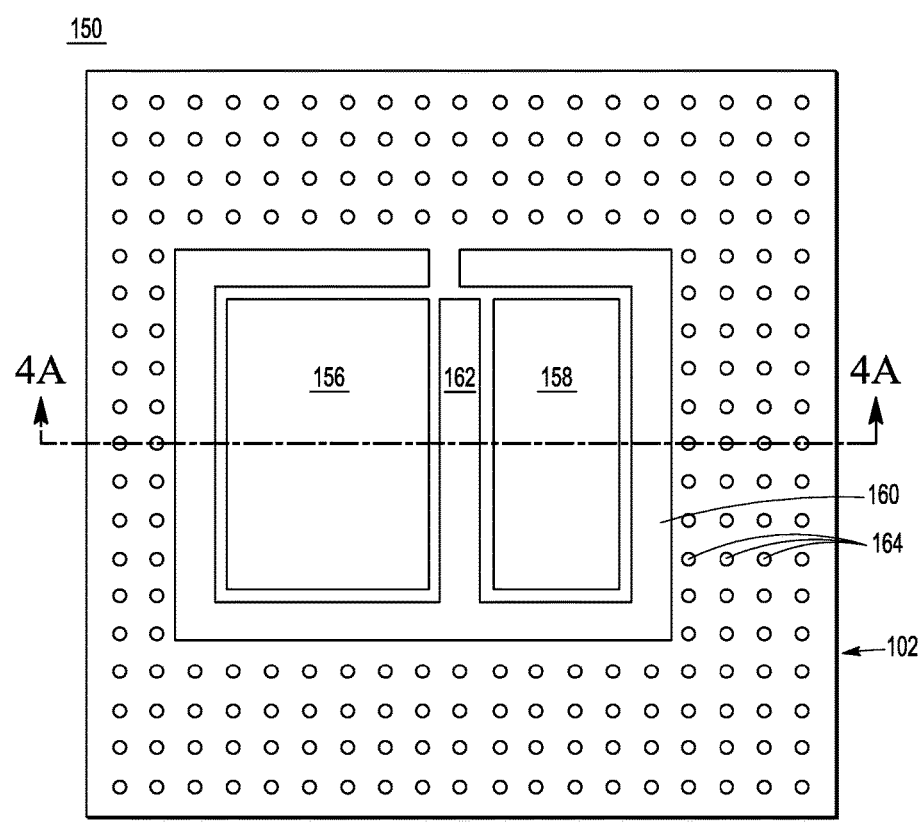

FIGS. 4A and 4B show a cross-sectional side view and a bottom plan view of a portion of a packaged semiconductor device 150 in accordance with an embodiment of the present invention. The packaged semiconductor device 150 is similar to the packaged semiconductor device 130 of FIGS. 3A and 3B except that it is modified to accommodate two dies. Referring to FIG. 4A, the device 150 comprises the substrate 102 having pillars 106, and first and second dies 152, 154. The first and second dies 152, 154 may be any kind of dies, such as a microprocessor and a sensor, or a processor and a memory, as are known in the art.

The first and second dies 152, 154 are attached to a top surface of the substrate 102 with a die attach material such as nonconductive epoxy or a double-sided tape, e.g., a DAF, and are disposed in a side-by-side arrangement with a space extending therebetween. Bonding pads on the dies 152, 154 are electrically connected to respective ones of the pillars 106 with bond wires. More particularly, in the embodiment shown, first bond wires 134 are used to electrically connect the dies 152, 154 to a ground connection, second bond wires 136 are used to connect the dies 152, 154 to a voltage source, and third bond wires 138 are used to connect the dies 152, 154 to signal pins.

Referring now to FIG. 4B as well as FIG. 4A, the device 150 includes a pair of ground pads 156 and 158 that are formed on the bottom side of the substrate 102 beneath the dies 152, 156 respectively. A power ring 160 also is formed on the bottom side of the substrate 102 that surrounds the ground pads 156, 158, and includes an arm 162 that extends between the ground pads 156, 158. The power ring 160 is outside of a footprint of the dies 152, 156. The arm 162 may be either connected at both ends to the power ring 160, connected at one end (as shown), or spaced from the power ring 160 at both ends. The bottom side of the substrate 102 also includes signal pads 164. The signal pads 164 are formed on the pillars 106 on the bottom side of the substrate 102. The ground pads 156 and 158 and the power ring 160 may be formed using solder or a film tape, and the signal pads 164 may be formed using solder or solder balls. The ground pads 156, 158 are electrically connected to the pillars beneath the dies 152, 154 as well as the at least one row of pillars adjacent to one of the dies 152, 154, and then to the dies 152, 154 with the first bond wires. The power ring 160 is electrically connected to another row of pillars surrounding the dies 152, 154 using the second bond wires 136. The signal pads 144 are electrically connected to the pillars 106 that are connected to the die bonding pads with the third bond wires 138 (used to transmit/receive signals from/to the dies 152, 154). The top surface of the substrate 102, the dies 152, 154 and the bond wires 134, 136 and 138 are encapsulated with a plastic material or mold compound 146 to protect the dies, the bond wires and the connections therebetween from damage.

In one embodiment, a routing tape including conductive vias and a metal routing layer may be attached to the bottom surface of the substrate 102. First, solder balls are attached to selected ones of the pillars 106 and then the routing tape is attached to the bottom side of the substrate 102 such that the conductive pillars 106 by way of the solder balls are electrically connected with the conductive vias of the routing tape. The tape includes internal traces that enable electrical interconnection between conductive pillars 106 outside of the die footprint with conductive pillars beneath the die 108. The routing tape preferably is sized and shaped to have the same (X and Y) dimensions as the finally assembled device such that solder balls of a uniform size can be applied to the bottom of the tape (and in contact with the conductive vias) for the package I/Os.

Figure 5:
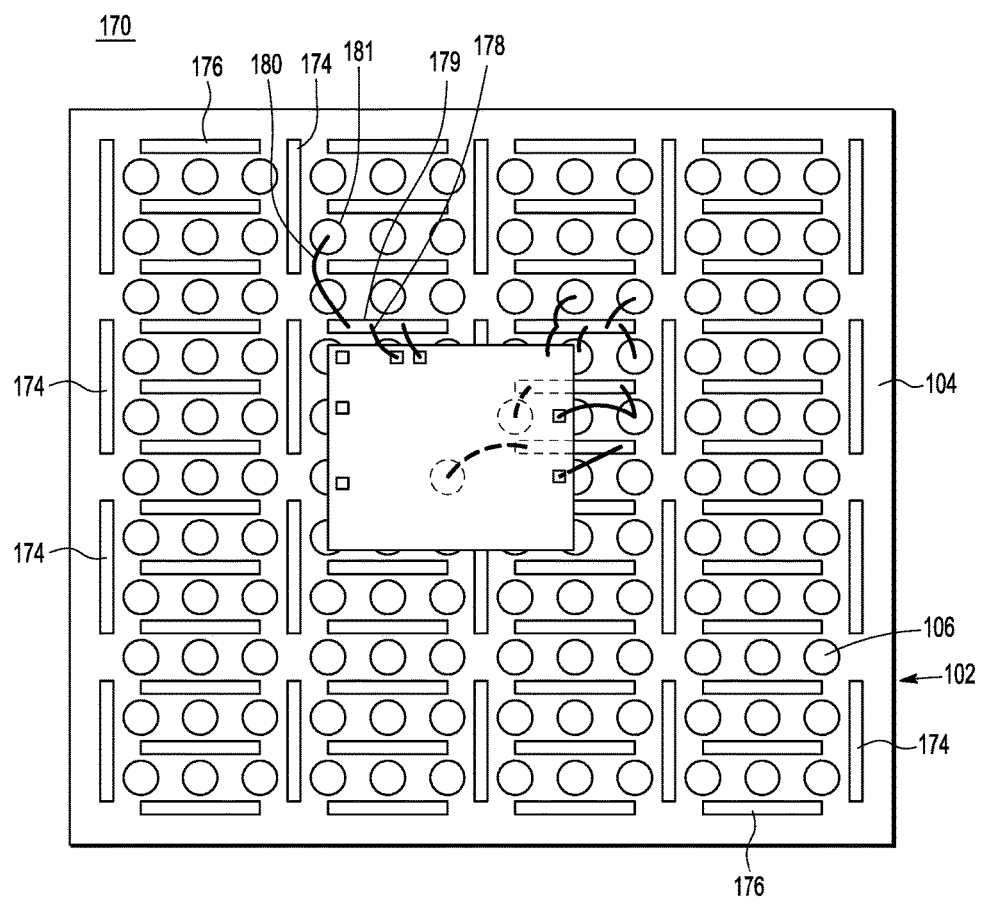
FIG. 5 is a top plan view of a partially assembled semiconductor device according to an embodiment of the present invention.

FIG. 5 is a top plan view of a partially assembled semiconductor device 170, which comprises the substrate 102 including the non-conductive substrate material 104 and the array of conductive pillars 106 formed in the substrate material 104. A semiconductor die 172 is mounted on and attached to the substrate 102 using a die attach adhesive or DAF. In this embodiment, the device 170 further comprises an array of conductive traces including a plurality of vertical traces 174 and a plurality of horizontal traces 176 formed on the top surface of the substrate 102. The traces 174 and 176 may comprise copper and be formed by electroplating, and are located between the rows and columns of the array of pillars 106.

The vertical and horizontal traces 174, 176 provide for many options for connecting bonding pads on the die 172 to the conductive pillars 106, including the pillars 106 that are beneath the footprint of the die 172. For example, two adjacent die bonding pads are connected with first bond wires 178 to one of the horizontal traces 179, and then a second bond wire 180 is connected between the horizontal trace 179 and one of the conductive pillars 181. In another example, a bond wire could connect from a die bonding pad to one of the traces (either horizontal or vertical) that extends from outside of the die footprint to underneath the die 172. Another bond wire, connected before die attach, could then be used to connect the trace to one of the conductive pillars underneath the die. In this manner, the present invention allows the conductive pillars beneath the die footprint to be used.

The present invention thus provides not only the structure for providing connections from the die bonding pads to the conductive pillars beneath the footprint of the die, but also a method therefor. The method comprises: connecting pillars under a die footprint to pillars outside the die footprint, for example, using first bond wires; and connecting pads on the die to the pillars outside the die footprint using second bond wires such that the pillars under the die footprint are in electrical contact with the pads on the die.

The method may further comprises forming a conductive ring on either the top or bottom surface of the substrate and in contact with the pillars for use as a power ring; and forming a conductive pad on either the top or bottom surface of the substrate and in contact with the pillars for use a ground pad.

FIGS. 6A and 6B are top plans views of a partially assembled semiconductor device 190 according to yet another embodiment of the present invention. The device 190 comprises a substrate 102 including vertical and horizontal conductive traces 174 and 176, like the device 170 (FIG. 5). The device 190 further comprises a die flag 192 that is sized and shaped to receive the die 172, as shown in FIG. 6B. The die flag 192 comprises a conductive tape or paste that functions to electrically short the conductive pillars 106 and the vertical and horizontal traces that are beneath the die footprint. After the die 172 is attached to the die flag 192, a bond wire 194 can be connected between a die bond pad and one of the traces such as horizontal trace 196. The horizontal trace 196 extends beneath the die 172 and therefore is in electrical contact with the die flag 192 and therefore with the conductive pillars 106 shorted to the die flag 192. In this manner, the invention allows the conductive pillars beneath the die footprint to be used.

Although the invention has been described in the context of IC packages having a single die and a single electrical connector, it will be understood that the invention can be implemented in the context of IC packages having any suitable numbers of dies and any suitable numbers of electrical connectors.

Also for purposes of this description, the terms "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

Unless explicitly stated otherwise, each numerical value and range should be interpreted as being approximate as if the word "about" or "approximately" preceded the value or range.

It will be understood that various changes in the details, materials, and arrangements of the parts which have been described and illustrated in order to explain embodiments of this invention may be made by those skilled in the art without departing from embodiments of the invention encompassed by the following claims.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The invention claimed is:

1. A substrate for a semiconductor device, comprising:
   an electrically non-conductive substrate material;
   an array of electrically conductive pillars formed in the substrate material, wherein the pillars extend from a top surface of the substrate material to a bottom surface of the substrate material;

a die flag formed on the top surface of the substrate material, wherein the die flag is sized and shaped for receiving a semiconductor die and some of the pillars are located under the die flag and other ones of the pillars are not located under the die flag; and one or more bars formed on the top surface of the substrate material, wherein the bars and the pillars are set in a staggered arrangement, wherein some of the bars are located under the die flag and other ones of the bars are not located under the die flag, and wherein one of the pillars and one of the bars disposed under the die flag are connected to selected ones of the pillars or bars outside of the die flag.

2. The substrate of claim 1, further comprising an electrically conductive ring formed on the top surface of the substrate material and surrounding the die flag, wherein the conductive ring comprises a plurality of bond wires that respectively connect ones of the conductive pillars surrounding the die flag.

3. The substrate of claim 1, wherein the die flag comprises an electrically conductive tape attached to the top side of the substrate material, wherein the tape is connected with a first set of the conductive pillars.

4. A packaged semiconductor device, comprising:

an electrically non-conductive substrate comprising an array of electrically conductive pillars extending from a top surface of the substrate to a bottom surface of the substrate;

a first electrical connector connecting pillars located under a die footprint to first selected ones of the pillars outside of the die footprint;

bars formed on the top surface of the substrate, wherein the bars and the pillars are disposed in a staggered arrangement, wherein some of the bars are located under the die footprint and other ones of the bars are not located under the die footprint, and at least one of the bars under the die footprint is connected to one of the bars outside of the die footprint;

a semiconductor die having a bottom, non-active surface attached to the top surface of the substrate, wherein the semiconductor die defines the die footprint; and a second electrical connector connecting a first set of pads on a top, active surface of the die to the first selected ones of the pillars outside of the die footprint such that the pillars located under the die footprint are in electrical contact with the first set of pads on the die.

5. The packaged device of claim 4, further comprising one or more electrically conductive rings formed on the top surface of the substrate that connect second selected ones of the pillars together that are located outside of the die footprint.

6. The packaged device of claim 4, further comprising one or more solder rings formed on the bottom surface of the substrate.

7. The package device of claim 4, further comprising a die flag formed on the top surface of the substrate, wherein the bottom surface of the semiconductor die is attached to the die flag.

8. The packaged device of claim 7, further comprising one or more ground rings formed by electrically connecting a row of pillars surrounding the die.

* * * * *